US011557878B2

United States Patent
Dagenais et al.

(10) Patent No.: US 11,557,878 B2
(45) Date of Patent: Jan. 17, 2023

(54) HIGH POWER, NARROW LINEWIDTH SEMICONDUCTOR LASER SYSTEM AND METHOD OF FABRICATION

(71) Applicant: University of Maryland, College Park, College Park, MD (US)

(72) Inventors: Mario Dagenais, Chevy Chase, MD (US); Yang Zhang, Hyattsville, MD (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 239 days.

(21) Appl. No.: 17/078,076

(22) Filed: Oct. 22, 2020

(65) Prior Publication Data

US 2021/0119417 A1 Apr. 22, 2021

Related U.S. Application Data

(60) Provisional application No. 62/924,489, filed on Oct. 22, 2019.

(51) Int. Cl.
*H01S 5/00* (2006.01)
*H01S 5/14* (2006.01)
(Continued)

(52) U.S. Cl.
CPC ............ *H01S 5/141* (2013.01); *H01S 5/0237* (2021.01); *H01S 5/02326* (2021.01); *H01S 5/0612* (2013.01); *H01S 5/1032* (2013.01)

(58) Field of Classification Search
CPC .... H01S 5/141; H01S 5/02326; H01S 5/0237; H01S 5/0612; H01S 5/1032; H01S 5/021; H01S 5/142; H01S 5/0261
See application file for complete search history.

(56) References Cited

U.S. PATENT DOCUMENTS 6,539,150 B2   3/2003  Van Weerden
6,856,641 B2 * 2/2005  Ksendzov ............. H01S 5/1032
                                                                372/98
(Continued)

OTHER PUBLICATIONS

Bland-Hawthorn et al., "Optimization algorithm for ultrabroadband multichannel aperiodic fiber Bragg grating filters", J. Opt. Soc. Am. A, vol. 25, No. 1, pp. 153-158 (Jan. 2008).
(Continued)

*Primary Examiner* — Kinam Park
(74) *Attorney, Agent, or Firm* — Carter, DeLuca & Farrell LLP; George Likourezos

(57) ABSTRACT

A laser system for generating a narrow linewidth semiconductor light beam includes a substrate, a gain chip affixed on the substrate and configured to amplify light beam, and an optical feedback photonic chip affixed on the substrate, optically coupled to the gain chip, and configured to output light beam, which has a narrow linewidth around a resonant frequency of the optical feedback photonic chip, to the gain chip. The optical feedback photonic chip includes first and second optical gratings, a first multimode interferometer (MMI) and a second MMI optically coupled with a respective end of the first and second optical gratings, a third MMI configured to output two light beams to the first and second MMIs, respectively, through a respective waveguide. Based on receiving a respective one of the two light beams, the first MMI outputs two light beams to its respective end of the first and second optical gratings and the second MMI outputs two light beams to its respective end of the first and second optical gratings, the first and second optical gratings output second and third light beams, the second light beam, of which a linewidth is narrower than a linewidth of the third light beam, is directed to the third MMI, and an output port of the third MMI is configured to direct the second light beam to the gain chip.

13 Claims, 7 Drawing Sheets

(51) Int. Cl.
  H01S 5/06       (2006.01)
  H01S 5/02326    (2021.01)
  H01S 5/0237     (2021.01)
  H01S 5/10       (2021.01)

(56) References Cited

U.S. PATENT DOCUMENTS

| | | | |
|---|---|---|---|
| 2014/0269800 A1 | 9/2014 | Purnawirman | |
| 2015/0063753 A1 | 3/2015 | Evans | |
| 2015/0109661 A1* | 4/2015 | Li | G02F 1/0147 359/341.4 |
| 2017/0098920 A1* | 4/2017 | Doerr | H01S 5/50 |
| 2017/0353008 A1* | 12/2017 | Sugiyama | H01S 5/101 |
| 2019/0199057 A1* | 6/2019 | Wen | H01S 5/021 |
| 2020/0366058 A1* | 11/2020 | Kawakita | H01S 5/068 |
| 2021/0050709 A1* | 2/2021 | Klein | H01S 5/0653 |

OTHER PUBLICATIONS

Zhu et al., "Arbitrary on-chip optical filter using complex waveguide Bragg gratings", App. Phys. Lett., 108, 101104 (2016), 6 pages.

Bland-Hawthorn et al., "A complex multi-notch astronomical filter to suppress the bright infrared sky", 10 Nature Communicatons, 2:581 (2011), 15 pgs.

Ellis et al., "Suppression of the near-infrared OH night sky lines with fibre Bragg gratings—first results", Monthly Notices of the Royal Astronomical Society, 425(3):1682-1695 (Jun. 2012).

Trinh et al., "The nature of the near-infrared interiine sky background using fibre Bragg grating OH suppression", Monthly Notices of the Royal Astronomical Society, 432(4):3262-3277 (Apr. 2013).

Trinh et al., "Gnosis: The First Instrument to Use Fiber Bragg Gratings for OH Suppression", The Astronomical Journal, 145(2):51 (Apr. 2013), 15 pgs.

Frank et al., "Nearly arbitrary on-chip optical filters for ultrafast pulse shaping", Optics Express, 22(19):22403-22410 (Sep. 2014).

Lv et al., "Synthesis of special fiber Bragg gratings filters by layer peeling algorithm", IEEE (Aug.-Sep. 2009) (2 pgs).

Feced et al., "An Efficient Inverse Scattering Algorithm for the Design of Nonuniform Fiber Bragg Gratings", IEEE J. of Quantum Elec, vol. 35, No. 8 (Aug. 1999), 11 pgs.

Buryak et al., "Comparison of Inverse Scattering Algorithms for Designing Ultrabroadband Fibre Bragg Gratings", Optics Express, 17(3):1995-2004 (Feb. 2009).

Verbist et al., "Weak gratings in silicon-on-insulator for spectral filters based on volume holography", Optics Letters, vol. 38, No. 3, pp. 386-388 (Feb. 2013).

Verbist et al., "Design of Weak 1-D Bragg Grating Filters in SOI Waveguides Using Volume Holography Techniques", J. of Lightwave Tech, vol. 32, No. 10, pp. 1915-1920 (May 2014).

\* cited by examiner

HIGH POWER, NARROW LINEWIDTH SEMICONDUCTOR LASER SYSTEM AND METHOD OF FABRICATION

CROSS REFERENCE TO RELATED APPLICATION

The present application claims the benefit of and priority to U.S. Provisional Application Ser. No. 62/924,489, filed on Oct. 22, 2019, the entire contents of which are incorporated herein by reference.

BACKGROUND

1. Technical Field

The present disclosure relates to systems for generating a high power, narrow linewidth semiconductor laser and methods for fabricating laser systems for generating high power, narrow linewidth semiconductor laser in high volume.

2. Background of Related Art

Semiconductor laser sources with ultra-narrow linewidth are highly desirable for a broad range of applications, such as coherent light detection and ranging (LIDAR) systems, high-speed coherent optical communications, interferometric fiber optic sensing, and self-driving cars, and the likes. The intensity and phase noise of the lasers are important factors in determining the performance of these systems. Compactly designed external cavity laser (ECL) modules based on optical self-injection feedback scheme have been used, where a small amount of light on the order of a few percent is fed back into the laser after being filtered by a high quality factor (Q) resonator. Such systems offer superior performance relative to that of conventional monolithic diode lasers, i.e., distributed feedback (DFB) lasers and distributed Bragg reflector (DBR) lasers, which typically show spectral linewidths of a few hundred kHz to a few tens of megahertz (MHz). There has been a need of advancement in high performance and simple laser systems capable of generating high power, ultra-narrow linewidth semiconductor lasers.

Researchers have utilized an external cavity or an external high-Q microring resonator to compress the linewidth of a conventional laser from a few MHz to several kilohertz (kHz) or even to approximately 10 hertz (Hz). The integrated narrow-linewidth ECL modules typically require complicated and time-consuming assembly steps that may not be suitable for cost-sensitive applications. This is especially the case in situations where two or more chips are actively aligned on a motherboard, polarization is tightly adjusted, and spatial mode matching is required. In order to make low cost, mass production possible, it is important to reduce high-skilled labor and related costs in assembly of such devices, thereby enabling low-skill operators to perform mass production.

SUMMARY

According to embodiments of the present disclosure, laser systems are provided to generate high power, narrow linewidth semiconductor lasers. Further, according to embodiments, methods are also provided to assemble such laser systems with passive alignment, thereby enabling low cost, mass production.

According to an embodiment of the present disclosure, a laser system for generating a narrow linewidth semiconductor light beam includes a substrate, a gain chip affixed on the substrate and configured to amplify light beam, and an optical feedback photonic chip affixed on the substrate, optically coupled to the gain chip, and configured to output light beam, which has a narrow linewidth around a resonant frequency of the optical feedback photonic chip, to the gain chip. The optical feedback photonic chip includes first and second optical gratings, a first multimode interferometer (MMI) and a second MMI optically coupled with a respective end of the first and second optical gratings, a third MMI configured to output two light beams to the first and second MMIs, respectively, through a respective waveguide. Based on receiving a respective one of the two light beams, the first MMI outputs two light beams to its respective end of the first and second optical gratings and the second MMI outputs two light beams to its respective end of the first and second optical gratings, the first and second optical gratings output second and third light beams, the second light beam, of which a linewidth is narrower than a linewidth of the third light beam, is directed to the third MMI, and an output port of the third MMI is configured to direct the second light beam to the gain chip.

In an aspect, the third MMI outputs the two light beams when a broadband light beam is coupled to the third MMI.

In another aspect, the third light beam is freed into free space.

In another aspect, the narrow linewidth is less than or equal to 10 kHz.

In still another aspect, power of a laser resulting from the gain chip is greater than or equal to about 100 mW.

In yet another aspect, each of the first and second optical gratings is a Fabry-Perot Bragg grating.

In still yet another aspect, the laser system further includes a heater disposed in proximity to the first and second optical gratings and configured to modulate a resonant frequency of the second light beam by supplying heat.

According to another embodiment of the present disclosure, a laser system for generating a narrow linewidth semiconductor light beam includes a substrate, a gain chip affixed on the substrate and configured to amplify light beam, and an optical feedback photonic chip affixed on the substrate, optically coupled to the gain chip, and configured to output light beam, which has a narrow linewidth around a resonant frequency of the optical feedback photonic chip, to the gain chip. The optical feedback photonic chip includes an optical grating and a multimode interferometer (MMI) configured to output light beams to each end of the optical grating through a respective waveguide. The optical grating outputs second and third light beams, the second light beam, of which a linewidth is narrower than a linewidth of the third light beam, is directed throughout the multimode interferometer, and an output port of the MMI is configured to direct the second light beam to the gain chip.

In an aspect, the third light beam is provided to a drop port of the MMI, which frees the third light beam into free space.

In another aspect, the narrow linewidth is less than or equal to 10 kHz.

In yet another aspect, power of a laser resulting from the gain chips is greater than or equal to about 100 mW.

In yet another aspect, the optical grating is a Fabry-Perot Bragg grating.

In still yet another aspect, the laser system further includes a heater disposed in proximity to the optical grating and configured to modulate a resonant frequency of the second light beam by supplying heat.

According to yet another embodiment of the present disclosure, a method for aligning two or more chips on a motherboard is provided. The method includes providing a first bonding pad and a second bonding pad on a substrate, applying solder onto the first bonding pad and the second bonding pad. placing a first chip having a third bonding pad and a second chip having a fourth bonding pad over the first bonding pad and the second bonding pad, respectively, and melting the solder to bake combination of the first and second chips and the substrate. A size of the first bonding pad is smaller than a size of the third bonding pad in a first direction and a second direction, which is not parallel with the first direction, and a size of the second bonding pad is smaller than a size of the fourth bonding pad in the first and second directions.

In an aspect, the first bonding pad is spaced apart from the second bonding pad.

In another aspect, the solder on the first bonding pad and the solder on the second bonding pad are separated by air.

In yet another aspect, the first and second directions are perpendicular to each other.

In yet another aspect, the first and second chips are placed adjacently along the first direction.

In yet another aspect, when the solder is melted, the first chip and the second chip are self-aligned to each other along the first direction due to a surface tension of the melted solder.

In still yet another aspect, the first chip and the second chip are center-aligned with the first bonding pad and the second bonding pad, respectively, along the second direction due to a surface tension of the melted solder.

The details of one or more aspects of the disclosure are set forth in the accompanying drawings and the description below. Other features, objects, and advantages of the techniques described in this disclosure will be apparent from the description and drawings, and from the claims.

BRIEF DESCRIPTION OF THE DRAWINGS

Embodiments of the present disclosure are described herein with reference to the accompanying drawings, wherein.

DETAILED DESCRIPTION OF EMBODIMENTS

Figure 1:
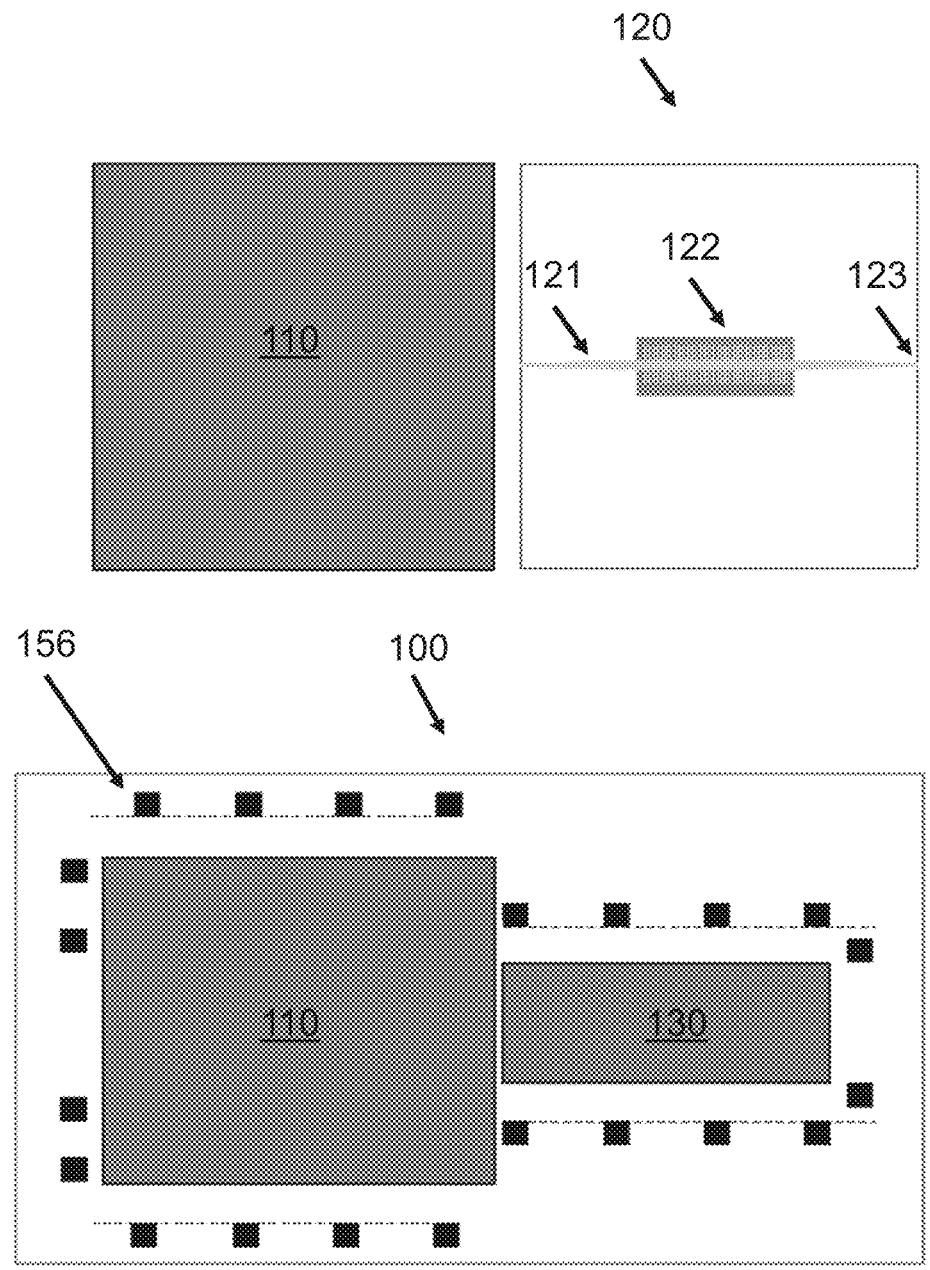
FIG. 1 is a block diagram of a typical laser feedback system.

Embodiments of the presently disclosed laser systems for generating high power, narrow linewidth laser and methods for assembling such laser system are described in detail with reference to the drawings. The laser systems utilize Bragg gratings to generate high power and narrow linewidth lasers and the methods utilize passive alignment so that fabrication of such laser systems can be made using mass production.

Like numerals in this disclosure generally refer to the same or at least similar parts or elements of laser systems. For example, 120 of FIG. 1, 220 of FIG. 2, 320 of FIG. 3, and 420 of FIG. 4 refer to the same or similar parts or elements of laser systems. Specifically, the same last two digits in three-digit numerals in this disclosure indicate that the three digit numerals are same or at least similar in features. Thus, when descriptions for the same or similar parts or elements of laser systems are duplicative or redundant, such descriptions may be omitted for the laser systems and referred to the corresponding descriptions for the laser systems previously described.

Some reference numerals or elements of laser systems are omitted from the figures because such reference numerals or elements can be readily appreciated by a person having skill in the art even with omission thereof. For example, FIGS. 3 and 4 do not include a motherboard such as a motherboard 250 of FIG. 2 because a person of skill in the art would readily apprehend a motherboard for FIGS. 3 and 4 even with omission of the motherboard. In this case, descriptions of the omitted elements can be found in the laser system described in FIG. 2.

FIG. 1 illustrates a block diagram of a typical laser feedback system 100 to generate a high power, narrow linewidth laser. In particular, the typical laser system 100 includes a motherboard 150, an optical feedback photonic chip 110, and a gain chip 130. The optical feedback photonic chip 110 and the gain chip 130 are affixed on the motherboard 150. The optical feedback photonic chip 110 generates and directs to the gain chip 130 a narrow linewidth laser, and the gain chip 130 amplifies the narrow linewidth laser so that more power is added to the narrow linewidth laser.

On the optical feedback photonic chip 110, an optical feedback photonic circuit 120 is fixedly mounted. The optical feedback photonic chip includes a waveguide 121, a Bragg grating 122, and a waveguide facet 123. The waveguide 121 guides a light beam therethrough, and the Bragg grating 122 reflects particular wavelengths of the light beam and transmits all others. Since the Bragg grating 122 reflects particular wavelengths, the reflected light beam has a narrow linewidth. However, the linewidth of the reflected light beam can be ranged from a few hundred kilo Hz (kHz) to a few tens of mega Hz (MHz). The grating 122 may have a reflectivity of order 5-30%. The narrow linewidth light beam can be transmitted through the grating 122 and this reflected light beam is transmitted to an output port of the laser system, which include the.

When the laser generated from this reflected light beam is to be employed in any precision-focused applications, for example, light detection and ranging (LIDAR), the linewidth of a few hundred kHz or a few tens of MHz might not be sufficiently narrow for such applications. For example, 10 kHz or even to approximately 10 Hz might be needed. Thus, a much narrower linewidth is in great need in such industries.

The reflected light beam is directed through the waveguide 121 to the waveguide facet 123, which faces a gain facet (not shown) of the gain chip 130. Through the waveguide facet 121 and the gain facet, the reflected light beam is amplified by the gain chip 130 to generate a high power, narrow linewidth laser. In this case, to optimize the transfer of power between the gain chip 130 and the optical feedback photonic chip 110, the optical feedback photonic chip 110 and the gain chip 130 need to be aligned over the motherboard 150. Several alignment markers 156 may be used to help aligning the optical feedback photonic chip 110 and the gain chip 130 over the motherboard 150.

Active alignment methods have been utilized to actively align the optical feedback photonic chip 110 and the gain chip 130. Specifically, the locations of the optical feedback photonic chip 110 and the gain chip 130 in space (i.e., (x, y, z) coordinates in XYZ coordinate system) are actively tracked even by placing a proxy for each on the motherboard 150. Because of location misalignments, the optical feedback photonic chip 110 and the gain chip 130 might have to be translated or shifted in the XYZ coordinate system to be aligned to each other. Further, the gap between the optical feedback photonic chip 110 and the gain chip 130 is often filled with epoxy to lock the alignment.

Thus, due to increased requirements toward finer precision (e.g., micrometer or nanometer ranges), such active alignment methods have required high costs and higher skilled operators, thereby preventing from mass production.

Following embodiments illustrated by FIGS. 2-7 show laser systems, which are capable of generating a high power, ultra-narrow linewidth laser and methods for aligning two or more chips on a motherboard by following self-alignment processes. The self-alignment processes make mass production possible because the self-alignment processes do not require high skilled operators and expensive manufacturing equipment.

Figure 2:
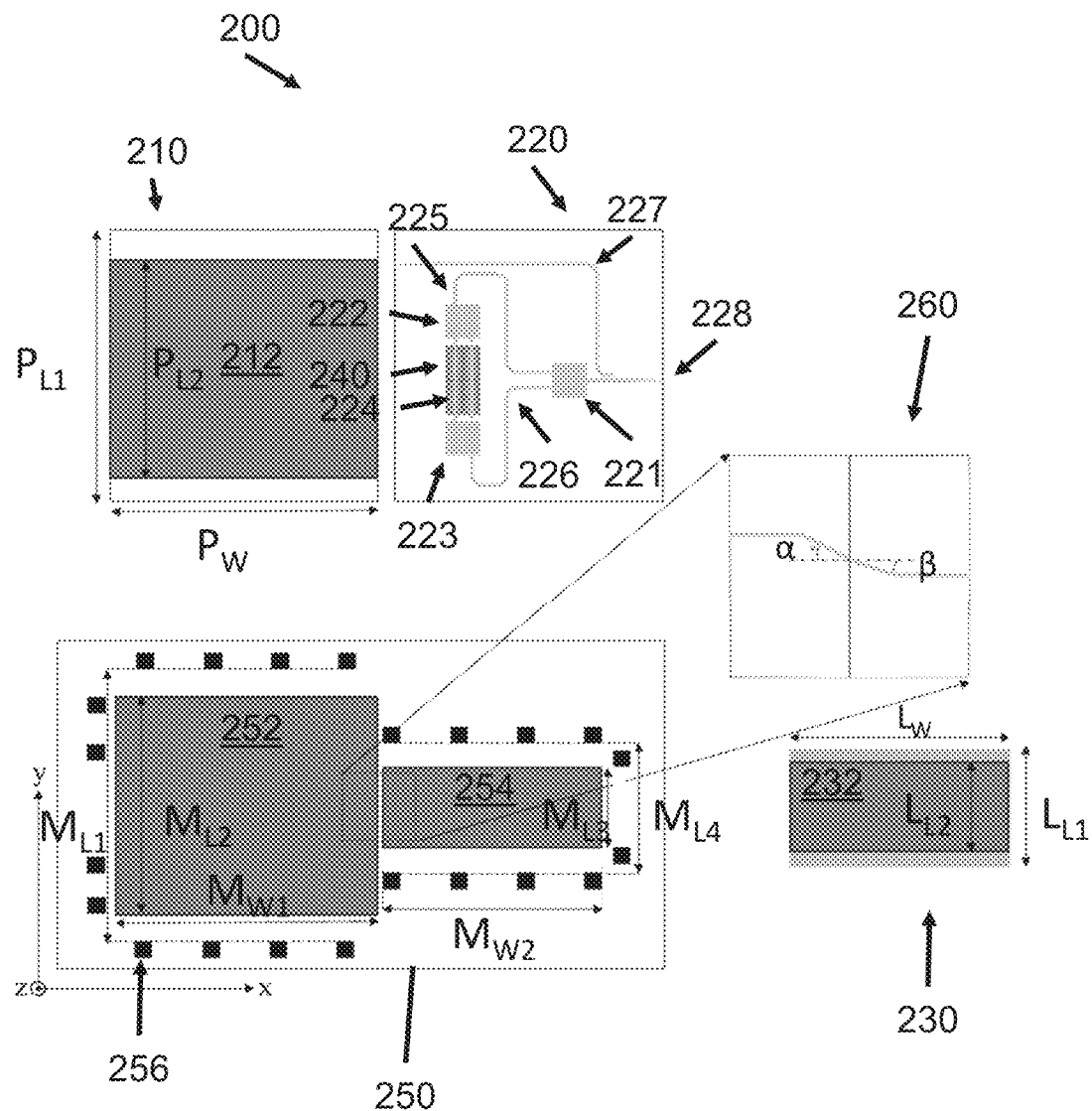
FIG. 2 is a block diagram of a laser system according to an embodiment of the present disclosure.

Provided in FIG. 2 is a laser system 200 according to an embodiment of the present disclosure. The laser system 200 may include an optical feedback photonic chip 210, a gain chip 230, and a motherboard 250. The optical feedback photonic chip 210 may provide a first bonding pad 212, with which the optical feedback photonic chip 210 is mounted on the motherboard 250. The length $P_{L1}$ of the optical feedback photonic chip 210 is greater than the length $P_{L2}$ of the first bonding pad 212, while the width $P_W$ of the optical feedback photonic chip 210 is as same as the width of the first bonding pad 212.

Similarly, the motherboard 250 may provide a second bonding pad 252 to be used to mount the optical feedback photonic chip 210 and a third bonding pad 254. FIG. 2 also shows a coordinate system, for example, the x, y, z coordinate system. The horizontal direction is the x-axis, the vertical direction is the y-axis, and the normal direction to the plane is the z-axis. In an aspect, the second and fourth bonding pads 252 and 254 are positioned along the x-axis.

The second bonding pad 252 may be bounded by alignment markers 256. Based on the alignment markers 256, which bound the second bonding pad 252, the second bonding pad 252 may be placed in the proper location over the motherboard 250. In an aspect, the distance $M_{L1}$ between the bottom surface of the top alignment markers 256 and the top surface of the bottom alignment markers 256, which bound the second bonding pad 252, may be longer along the y-axis than the length $P_{L1}$ of the optical feedback photonic chip 210. On the other hand, the length $M_{L2}$ of the second bonding pad 252 is shorter along the y-axis than the length $P_{L2}$ of the first bonding pad 212 and the width $M_{W1}$ of the second bonding pad 252 is also shorter along the x-axis than the width $P_W$ of the first bonding pad 212. The smaller size of the second bonding pad 252 than the size of the first bonding pad 212 in both directions, for example, the x- and y-axes, may be purposefully designed to enable self-alignment as described below with respect to FIGS. 6A and 6B.

The gain chip 230 may also include a third bonding pad 232. The length $L_{L1}$ of the gain chip 230 is greater than the length $L_{L2}$ of the third bonding pad 232, and the width $L_W$ of the gain chip 230 is equal to the width of the third bonding pad 232. The gain chip 230 may include an optical gain photonic circuit mounted thereon. The optical gain photonic circuit may be configured to amplify the power of the light beam inputted to the gain chip 230.

Similarly, the motherboard 250 may also provide a fourth bonding pad 254 to be used to mount the third bonding pad 232. The fourth bonding pad 254 may be bounded by alignment markers 256. Based on the alignment markers 256, the fourth bonding pad 254 may be placed in the proper location over the motherboard 250. In an aspect, the distance $M_{L4}$ between the bottom surface of the top alignment markers 256 and the top surface of the bottom alignment markers 256, which bound the fourth bonding pad 254, may be longer along the y-axis than the length $L_{L1}$ of the gain chip 230. On the other hand, the length $M_{L3}$ of the fourth bonding pad 254 is shorter along the y-axis than the length $L_{L2}$ of the third bonding pad 232, and the width $M_{W2}$ of the fourth bonding pad 254 is also shorter along the x-axis than the width $L_W$ of the third bonding pad 232. The smaller size of the fourth bonding pad 254 than the size of the third bonding pad 232 in both directions, for example the x- and y-axes, may be purposefully designed to enable self-alignment as described below with respect to FIGS. 6A and 6B.

An optical feedback photonic circuit 220 may be patterned on one side of the optical feedback photonic chip 210, which is the same as opposite to the side where the first bonding pad 212 is mounted. The optical feedback photonic circuit 220 may include first, second, third multimode interferometers (MMIs) 221-223, a Bragg grating 224, and waveguides 225-227. In an aspect, the Bragg grating 224 may be made of $Si_3N_4$ due to its benefits like low optical losses, transparency over a wide wavelength range (400-2350 nm), compatibility with CMOS and wafer-scale foundry processes, and high-power handling capabilities. Benefits of using $Si_3N_4$ as a waveguide include low two-photon absorption or free-carrier absorption at high powers, while still having a high index contrast (approximately 0.5) allowing for compact devices. In another aspect, any materials, which lose less than 1 dB/cm and is capable of handling high optical power, may be selected for the waveguide. Such materials allow a laser designer the ability to store many photons in extremely high Q resonators or long on-chip cavities.

The Bragg grating 224 is optically coupled to the second and third MMIs 222 and 223 on both ends of the Bragg grating 224. The second and third MMIs 223 and 224 are optically coupled to the first MMI 221 via the waveguides 225 and 226, respectively. In an aspect the number of Bragg grating 224 may be one or more than two to meet requirements of the laser to be generated. In another aspect, the MMI 221-223 may be Michelson interferometers or Mach Zehnder interferometers.

The Bragg grating 224 may be Fabry-Perot Bragg grating, which includes a cavity in the middle thereof. The Bragg grating 224 may include two Fabry-Perot Bragg gratings. The cavity may be for a pi/2-phase shift. In an aspect, the cavity may be designed to have any other phase shifts.

When a broadband light beam is provided or directed to the optical feedback photonic circuit 220, the first MMI 221 emits or outputs two identical light beams having the same intensity to provide equally to each of the second and third MMIs 222 and 223. The second MMI 222 also emits or outputs two identical light beams to one end of the two Fabry-Perot Bragg gratings 224 and the third MMI 23 emits or outputs two identical light beams to the other end of the two Fabry-Perot Bragg grating 224. Due to the pi-phase shift cavity, the Fabry-Perot Bragg gratings 224 transmit very narrow linewidth light beam and reflect the other frequencies. The reflected narrow linewidth light beam is directed or guided from the second and third MMIs 222 and 223 to the first MMI 221 via the waveguides 225 and 226, respectively. The two narrow linewidth light beams from the second and third MMIs 222 and 223 are superimposed or added together at the first MMI 221 and directed or provided to the waveguide facet 228.

In an aspect, the optical feedback photonic circuit 220 may include a heater 240 in proximity to the Bragg grating 224, which provides heat to the Bragg grating 224. In response to the heat, the resonance frequency of the narrow linewidth light beam may be modulated. Further, a heat pattern may be controlled to modulate the frequency pattern of the narrow linewidth light beam, which is reflected by the Bragg grating 224.

As illustrated in FIG. 2, there is a gap between the waveguide facet 228 and the gain chip 230. The gap may be filled with air. Based on the Snell's law below, the light beam provided to the waveguide facet 228 might be refracted at the boundary between the waveguide facet 228 and the air.

$$\frac{\sin\theta_1}{\sin\theta_2} = \frac{v_2}{v_1} = \frac{n_1}{n_2},$$

where $\theta_1$ is the incident angle measured from the normal to the boundary, $\theta_2$ is the refracted angle measured from the normal to the boundary, $v_1$ is the speed of the light beam in the first medium, $v_2$ is the speed of the light beam in the second medium, $n_1$ is the refractive index of the first medium, and $n_2$ is the refractive index of the second medium. In this instance, the first medium is the material of the waveguide of the optical feedback photonic circuit 220 and the second medium is the air.

Thus, even though the optical feedback photonic chip 210 is parallelly positioned with the gain chip 230, the waveguide of the optical feedback photonic circuit 220 may not be positioned normal to the side of the waveguide facet 228 of the optical feedback photonic chip 210. As shown in the expanded view 260, the waveguide of the optical feedback photonic circuit 220 may be designed to have an angle $\alpha$ with respect to the line normal to the side of the optical feedback photonic chip 210.

When the light beam enters the gain chip 230, the first medium is the air and the second medium is the material of the waveguide of the gain chip 230. So, the waveguide in the gain chip 230, which is to receive the light beam from optical feedback photonic chip 210, may be designed to have an angle $\beta$ with respect to the line normal to the side of the gain chip 230 based on the Snell's law. The angles $\alpha$ and $\beta$ may be changed based on the refractive index of the material of the optical feedback photonic chip 210 and the material of the gain chip 230.

In an aspect, the waveguide of the optical feedback photonic circuit 210 may be made of $Si_3N_4$ surrounded by $SiO_2$ in all directions. In this instance, the refractive index of the waveguide of the optical feedback photonic circuit 220 is about 1.5, the refractive index of the air is 1, and the refracted angle is about 22 degrees. Thus, based on the Snell's law, the incident angle is about 15 degrees. Thus, the angle $\alpha$ is about 15 degrees. In the same way, the angle $\beta$ may be about 6 degrees if the refractive index of the waveguide of the gain chip 230 is 3.5 and the incident angle is about 22 degrees. This example is provided only for illustrative purposes, and the angles $\alpha$ and $\beta$ may change in response to the materials and refractive indices of the waveguides of the optical feedback photonic circuit 220 and the gain chip 230.

Figure 3:
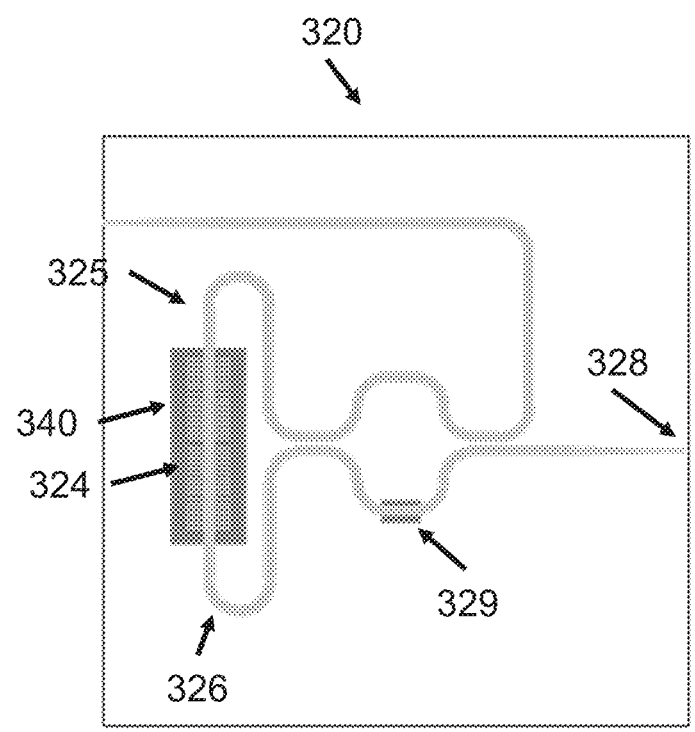
FIG. 3 is a block diagram of an optical feedback photonic circuit according to an embodiment of the present disclosure.
Figure 4:
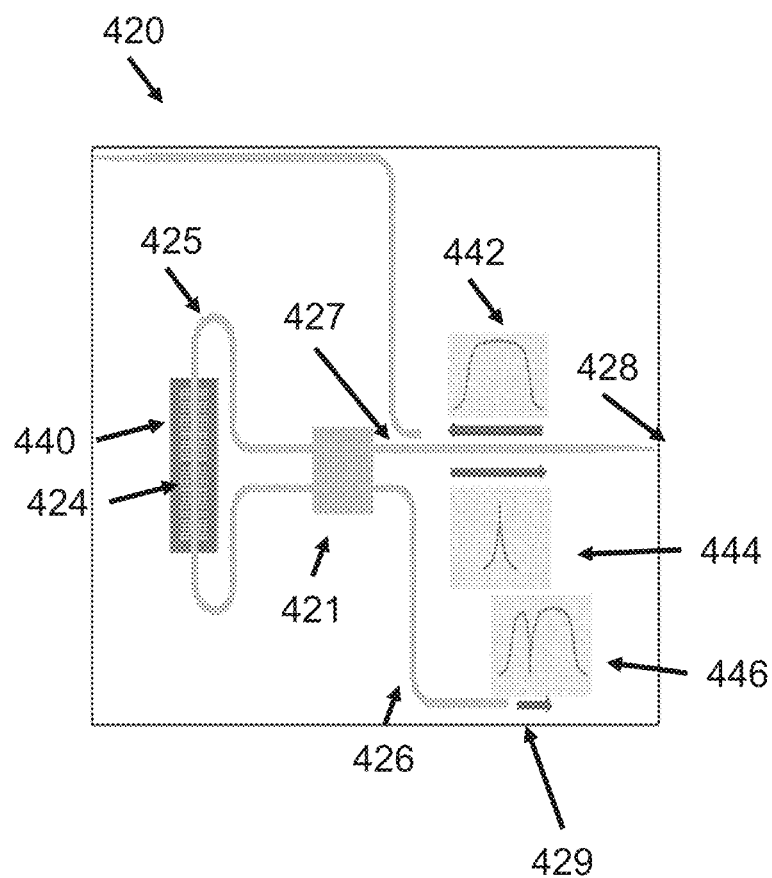
FIG. 4 is a block diagram of an optical feedback photonic circuit according to an embodiment of the present disclosure.

Since the designs of the optical feedback photonic chip, the gain chip, and the motherboard of FIGS. 3 and 4 may be the same, the optical feedback photonic chip, the gain chip, and the motherboard in FIGS. 3 and 4 are omitted and description thereof may be found in the description with reference to FIG. 2. An optical feedback photonic circuit 320 is illustrated in FIG. 3 according to an embodiment of the present disclosure. The optical feedback photonic circuit 320 may include two directional couplers 329, a Bragg grating 324, and waveguides 325 and 326. When light beam is inputted, the Bragg grating 324 transmits and reflects light beam. The reflected light beam, which has a narrow linewidth, is guided by the waveguides 325 and 326 to the two directional couplers 329. In an aspect, the two directional coupler 329 may be a Mach Zehnder interferometer.

The reflected light beam is then directed or provided to the waveguide facet 328 to a gain chip. The other light beam from the Bragg grating 324 is freed via the waveguide 325. In an aspect, the Bragg grating 324 may be surrounded by a heater 340. In response to the heat provided by the heater 340, the resonance frequency of the reflected light beam may be controlled and modulated.

FIG. 4 illustrates an optical feedback photonic circuit 420 according to an embodiment of the present disclosure. In this embodiment, the optical feedback photonic circuit 420 may include an MMI 421, a Bragg grating 424, and waveguides 425-427. The optical feedback photonic circuit 420 may be a combination of the optical feedback photonic circuit 220 of FIG. 2 and the optical feedback photonic circuit 320 of FIG. 3. In particular, the Fabry-Perot Bragg grating 424 may be based on optical feedback photonic circuit 320 of FIG. 3 and the waveguides 425-427 may be based on optical feedback photonic circuit 220 of FIG. 2.

When a broadband light beam 442 is provided to the waveguide 427, the broadband light beam 442 is coupled to and provided to the Bragg grating 424, which transmits the narrow linewidth light beam 444 and reflects the other frequency light beam 446. The narrow linewidth light beam 444 is guided by the waveguide 427 back to the waveguide facet 428, and the other frequency light beam 446 is guided by the waveguide 426 to a dump port 429. The reflected light beam 446 may be freed via the dump port 429. When a gain chip amplifies the narrow linewidth light beam 444, a high power and narrow linewidth laser can be generated. In an aspect, the high power, narrow linewidth light beam after the amplification may have a linewidth ranging from 10 kHz to 10 Hz and a power level greater than or equal to 10 milliwatts (mW).

In an aspect, the optical feedback photonic circuit 420 may include a heater 440 surrounding the Bragg grating 424 to control modulation of the resonant frequency of the narrow linewidth light beam.

Figure 5:
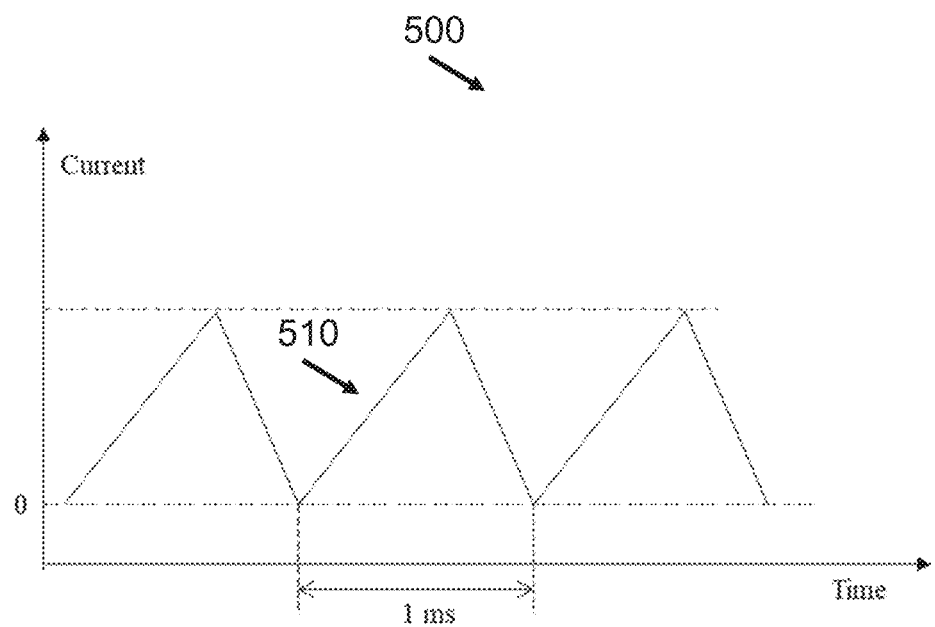
FIG. 5 is a graphical curve illustrating a current pattern for frequency modulation of a laser according to an embodiment of the present disclosure.

FIG. 5 illustrates a current pattern for frequency modulation of a laser according to an embodiment of the present disclosure. When a laser generated by using an optical feedback photonic chip and a gain chip is used in a lidar system, the resonance frequency is to be modulated to measure distance and/or velocity of an object. The time difference between transmitting the laser and receiving the laser reflected off from the object can be used to measure the distance between the lidar system and the object, and a frequency shift in the received laser can be used to measure the velocity of the object. Thus, the frequency modulation of the laser may be employed in the optical feedback photonic circuit 220, 320, and 420 of FIGS. 2-4. In this regard, a heater is utilized and may provide a heat pattern based on a current pattern provided to the heater. As shown in FIG. 5, the current pattern 510 may be repeated, e.g., every millisecond. Based on the current pattern provided to the Bragg grating (e.g., Fabry-Perot Bragg grating), the resonant frequency of the narrow linewidth light beam may be modulated or increased/decreased by the Bragg grating. In an aspect, the period and the pattern of the current may be adjusted according to requirements of the lidar system. Further, based on laser systems which utilize the optical feedback photonic chip and gain chip, the heat pattern may be adjusted.

Figure 6A:
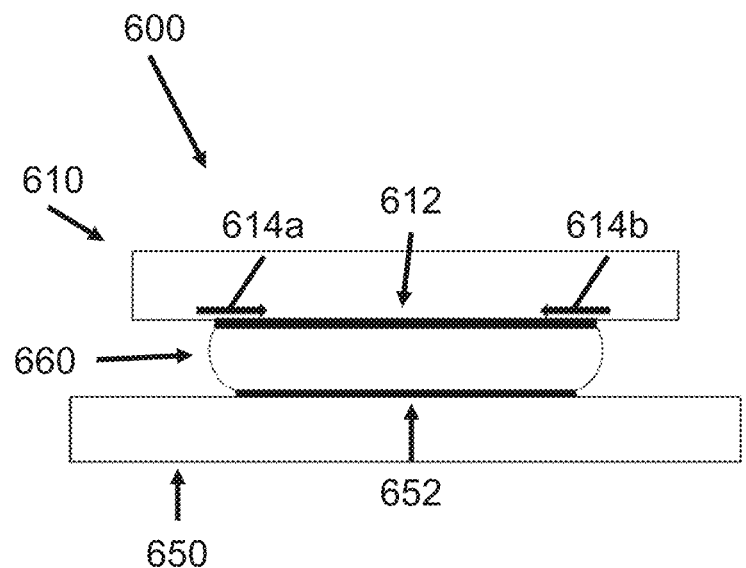
FIG. 6A is a block diagram for illustrating assembly of a laser system according to an embodiment of the present disclosure.
Figure 6B:
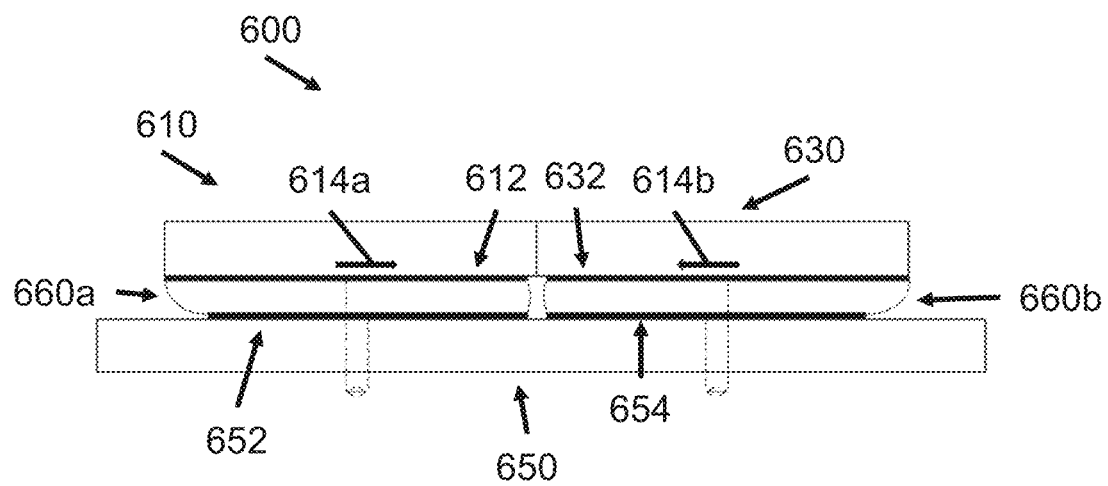
FIG. 6B is a block diagram for illustrating assembly of a laser system including an optical feedback photonic circuit and a gain circuit according to an embodiment of the present disclosure.

FIGS. 6A and 6B illustrate how two chips can be self-aligned based on band pad designs according to embodiments of the present disclosure. As described above, alignment of an optical feedback photonic chip 610 and a gain chip 630 on a motherboard 650 is critical in reducing reflection and improving efficiencies. FIG. 6A shows a cross-sectional view of the assembly across one direction (e.g. the y-axis). A bonding pad 612 of the optical feedback photonic chip 610 is larger than a bonding pad 652 of the motherboard 650. The bonding pad 612 may be mounted on the bonding pad 652. In particular, solder 660 is placed over the bonding pad 652 and the bonding pad 612 is placed over the solder 660. In an aspect, the solder 660 may be made of AuSn. The thickness of the solder 660 may be about 20-50 μm.

Due to the manual placement of the bonding pad 612 by a standard pick-and-place hardware, the bonding pads 612 and 652 may be off the centers thereof. When the combination 600 of the chip 610 and the motherboard 650 is baked by a baking device, the solder 660 becomes liquified. Since the difference in size between the bonding pads 612 and 652 and the surface tension of the liquified solder 660, the left portion of the bonding pad 612 is pulled toward the center or to the right direction 614a and the and right portion of the bonding pad 612 is pulled toward the center or the left direction 614b of the solder 660 so that the center of the bonding pad 612 and the center of the bonding pad 652 are aligned to each other.

FIG. 6B also shows how two chips, the optical feedback photonic chip 610 and the gain chip 630 can be self-aligned on the motherboard 650 along another direction (e.g., the x-axis) according to embodiments of the present disclosure. As described in FIG. 2 with respect to the bonding pads 212, 232, 252, and 254, the bonding pad 612 of the optical feedback photonic chip 610 is larger than the bonding pad 652 of the motherboard 650 and the bonding pad 632 of the gain chip 630 is larger than the bonding pad 654 of the motherboard 650. Solder balls 660a and 660b may be asymmetrical to each other in size and placed over the bonding pads 652 and 654, and then the bonding pads 612 and 632 are placed over the solder balls 660a and 660b, respectively.

Due to the manual nature of the placement by the pick-and-place hardware, initial placement may not be aligned between the bonding pads 652, 654 of the motherboard 650 and the bonding pads 612 and 632. However, in the baking process, the solder balls 660a and 660b become liquified, the optical feedback photonic chip 610 is moved toward the center of the two bonding pads 652 and 654 or to the right direction 614a due to the surface tension of the liquified solder ball 660a and the size difference, and the gain chip 630 is also moved toward the center of the two bonding pads 652 and 654 or to the left direction 614b due to the surface tension of the liquified solder ball 660a and the size difference.

When aligned, the distance between the centers of the bonding pad 612 and the bonding pad 652 is $D_1$, and the distance between the centers of the bonding pad 612 and the bonding pad 652 is $D_2$. These distances $D_1$ and $D_2$ may be about few micrometers. In an aspect, $D_1$ may be different from $D_2$ because of the different size between the bonding pads 612 and 632. In another aspect, the distance $D_1$ or $D_2$ may be adjusted based on the lengths of the bonding pads 612 and 652 or the lengths of the bonding pads 632 and 654, respectively, along the direction, along which the two chips 610 and 630 are positioned.

Figure 7:
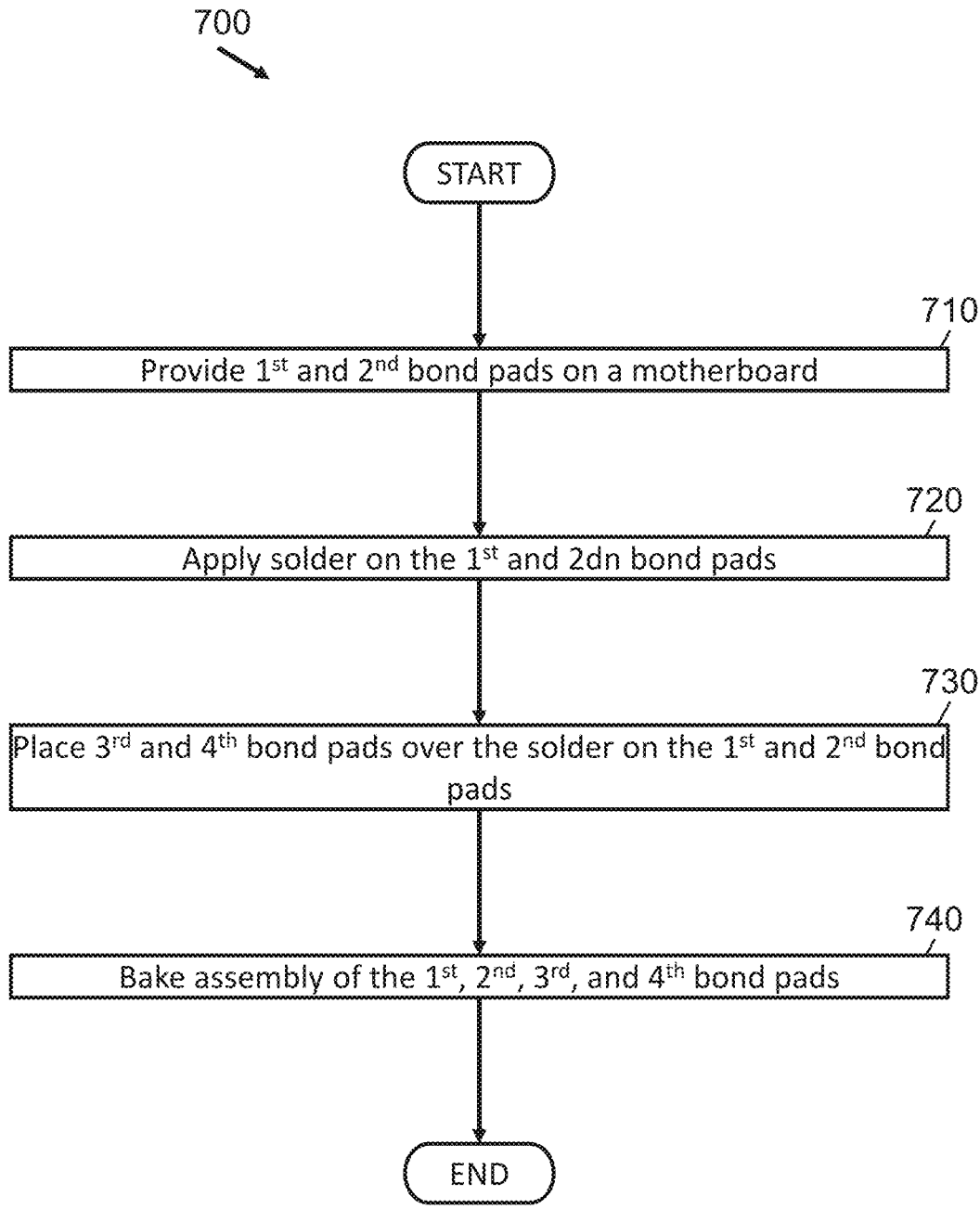
FIG. 7 is a flowchart illustrating assembly of at least two optical photonic circuits according to an embodiment of the present disclosure.

FIG. 7 shows a method 700 for self-aligning two or more chips on a motherboard according to an embodiment of the present disclosure. The method 700 starts by providing first and second bonding pads on a motherboard in step 710. Two circuits mounted on the first second bonding pads are optically coupled. In an aspect, the number of bonding pads may be more than two. The two bonding pads are separated by air. In another aspect, the bonding pads may be made of gold. In still another aspect, the material of the bonding pads may be other than gold, which can be appreciated by a person having skill in the art.

In step 720, solder is applied to the two bonding pads on the motherboard, and in step 730, two chips may be mechanically placed over the solder balls formed over the first and second bonding pads by a standard pick-and-place hardware. Due to manual nature of placement and mechanical errors, the two chips can be placed at incorrect positions over the solder balls. The two chips include third and fourth bonding pads, respectively. The third and fourth bonding pads have different sizes from the first and second bonding pads of the motherboard, respectively.

In step 740, the assembly of the first through fourth bonding pads is baked by a baking device. The temperature during the baking process is higher than the melting temperature of the solder balls. Thus, during the baking process, the solder balls applied to the bonding pads is melted or liquified.

The third bonding pad is larger in size than the first bonding pad, and the fourth bonding pad is larger in size than the second bonding pad, as similarly shown in FIGS. 6A and 6B. Due to the larger size of the third and fourth bonding pads and the surface tension of the liquified solder balls, the two chips are self-aligned with respect to the first and second bonding pads along two directions, e.g., x- and y-axis directions. As a result, the bonding pads are self-aligned. Thus, based on this self-alignment method 700, the level of skills in aligning chips on the motherboard can be lowered, the cost and time can also be lowered, and the standard pick-and-place hardware can be used.

In an aspect, the method 700 may be performed by a computer. In particular, a memory stores a program including sets of instructions and a processor may execute the sets of the instructions to perform the method 700.

In another aspect, the method 700 may be used in any technology areas where two chips are to be mounted and aligned on a motherboard. The technology areas may include self-driving cars with a LIDAR system, RF photonic analog links in communication systems, and tunable laser for spectroscopy.

It should be understood that various aspects disclosed herein may be combined in different combinations than the combinations specifically presented in the description and accompanying drawings. It should also be understood that, depending on the example, certain acts or events of any of the processes or methods described herein may be performed in a different sequence, may be added, merged, or left out altogether (e.g., all described acts or events may not be necessary to carry out the techniques).

What is claimed is:

1. A laser system for generating a narrow linewidth semiconductor light beam, the laser system comprising:
a substrate;
a gain chip affixed on the substrate and configured to amplify light beam; and
an optical feedback photonic chip affixed on the substrate, optically coupled to the gain chip, and configured to output a light beam, which has a narrow linewidth around a resonant frequency of the optical feedback photonic chip, to the gain chip, the optical feedback photonic chip including:
first and second optical gratings;
a first multimode interferometer (MMI) and a second MMI optically coupled with a respective end of the first and second optical gratings;
a third MMI configured to output two light beams to the first and second MMIs, respectively, through a respective waveguide,
wherein, based on receiving a respective one of the two light beams, the first MMI outputs two light beams to its respective end of the first and second optical gratings and the second MMI outputs two light beams to its respective end of the first and second optical gratings,
wherein the first and second optical gratings output second and third light beams,
wherein the second light beam, of which a linewidth is narrower than a linewidth of the third light beam, is directed to the third MMI, and
wherein an output port of the third MMI is configured to direct the second light beam to the gain chip.

2. The laser system according to claim 1, wherein the third MMI outputs the two light beams when a broadband light beam is coupled to the third MMI.

3. The laser system according to claim 1, wherein the third light beam is freed into free space.

4. The laser system according to claim 1, wherein the narrow linewidth is less than or equal to 10 kHz.

5. The laser system according to claim 1, wherein power of a laser resulting from the gain chip is greater than or equal to about 100 mW.

6. The laser system according to claim 1, wherein the first and second optical gratings are Fabry-Perot Bragg gratings.

7. The laser system according to claim 1, further comprising:
a heater disposed in proximity to the first and second optical gratings and configured to modulate a resonant frequency of the second light beam by supplying heat.

8. A laser system for generating narrow linewidth semiconductor light beam, the laser system comprising:
a substrate;
a gain chip affixed on the substrate and configured to amplify light beam; and
an optical feedback photonic chip affixed on the substrate, optically coupled to the gain chip, and configured to output light beam, which has a narrow linewidth around a resonant frequency of the optical feedback photonic chip, to the gain chip, the optical feedback photonic chip including:
an optical grating; and
a multimode interferometer (MMI) configured to output two light beams to each end of the optical grating through a respective waveguide,
wherein the optical grating outputs second and third light beams,
wherein the second light beam, of which a linewidth is narrower than a linewidth of the third light beam, is directed throughout the multimode interferometer, and
wherein an output port of the MMI is configured to direct the second light beam to the gain chip.

9. The laser system according to claim 8, wherein the third light beam is provided to a drop port of the MMI, which frees the third light beam into free space.

10. The laser system according to claim 8, wherein the narrow linewidth is less than or equal to 10 kHz.

11. The laser system according to claim 8, wherein power of a laser resulting from the gain chip is greater than or equal to 100 mW.

12. The laser system according to claim 8, wherein the optical grating is a Fabry-Perot Bragg grating.

13. The laser system according to claim 8, further comprising:
a heater disposed around the optical grating and configured to modulate a resonant frequency of the second light beam by supplying heat.

* * * * *